United States Patent
Feigl et al.

(10) Patent No.: US 11,856,705 B2
(45) Date of Patent: Dec. 26, 2023

(54) APPARATUS FOR HANDLING COMPONENTS

(71) Applicant: Muehlbauer GmbH & Co. KG, Roding (DE)

(72) Inventors: Stefan Feigl, Eschlkam (DE); Siarhei Lakhadanau, Roding (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 0 days.

(21) Appl. No.: 17/753,900

(22) PCT Filed: Sep. 1, 2020

(86) PCT No.: PCT/EP2020/074307
§ 371 (c)(1),
(2) Date: Mar. 17, 2022

(87) PCT Pub. No.: WO2021/052745
PCT Pub. Date: Mar. 25, 2021

(65) Prior Publication Data
US 2022/0330465 A1 Oct. 13, 2022

(30) Foreign Application Priority Data
Sep. 18, 2019 (DE) .......................... 102019125134.6

(51) Int. Cl.
*H05K 13/04* (2006.01)
*H05K 13/08* (2006.01)
*H05K 13/00* (2006.01)

(52) U.S. Cl.
CPC ..... *H05K 13/0413* (2013.01); *H05K 13/0015* (2013.01); *H05K 13/041* (2018.08); *H05K 13/0812* (2018.08)

(58) Field of Classification Search
CPC ............. H01L 21/683; H01L 21/67144; H01L 21/67259; H05K 13/0015; H05K 13/041; H05K 13/0413; H05K 13/0812
See application file for complete search history.

(56) References Cited

U.S. PATENT DOCUMENTS 4,619,043 A * 10/1986 Takahashi ............ H05K 13/043
269/254 R
5,750,979 A 5/1998 Yamamoto et al.
(Continued)

FOREIGN PATENT DOCUMENTS

DE 19913134 A1 10/1999
DE 102004015848 A1 10/2005
(Continued)

*Primary Examiner* — Paul D Kim
(74) *Attorney, Agent, or Firm* — John A. Miller; Shumaker, Loop & Kendrick LLP

(57) ABSTRACT

A device for handling components that is designed and equipped to handle components with multiple lateral surfaces and/or edges of the lateral surfaces. The device has at least one receiving tool, which is arranged on a turning device, for a respective component of the components, where the receiving tool is designed and equipped to receive the respective component on one of the component cover surfaces. The turning device is designed and equipped to rotate the receiving tool on a turning plane about a turning axis, and in the process optionally convey a component located on the receiving tool from a receiving position to one or more orientation positions, optionally one or more inspecting positions, a setting-down position, and optionally an ejecting position. The device also has a holding and supplying device, which faces the receiving position, for a component supply, and a discharge device.

11 Claims, 5 Drawing Sheets

(56) References Cited

U.S. PATENT DOCUMENTS

| | | | |
|---|---|---|---|
| 7,191,511 B2 * | 3/2007 | Noda | H05K 13/081 29/832 |
| 9,261,463 B2 * | 2/2016 | Shiraishi | G01N 21/8806 |
| 9,510,460 B2 * | 11/2016 | Cheung | H05K 13/0813 |
| 11,152,243 B2 * | 10/2021 | Augst | H01L 21/681 |

FOREIGN PATENT DOCUMENTS

| | | |
|---|---|---|
| DE | 102004051301 A1 | 6/2006 |
| DE | 102010053912 A1 | 6/2012 |
| DE | 102014101901 A1 | 8/2015 |
| DE | 102016011497 A1 | 3/2018 |
| DE | 102017008869 B3 | 10/2018 |
| EP | 0906011 A2 | 3/1999 |
| EP | 1588402 B1 | 8/2011 |
| EP | 2075829 B1 | 10/2011 |
| EP | 1470747 B1 | 5/2014 |
| EP | 3336024 A1 | 6/2018 |
| JP | S5029439 A | 3/1975 |
| JP | H01193630 A | 8/1989 |
| JP | H02193813 A | 7/1990 |
| JP | H08227904 A | 9/1996 |
| JP | 2001074664 A | 3/2001 |
| JP | 2007095725 A | 4/2007 |
| JP | 4911714 B2 | 4/2012 |
| JP | 2012116529 A | 6/2012 |
| JP | 5510923 B2 | 6/2014 |
| JP | 2014178335 A | 9/2014 |
| JP | 5783652 B2 | 9/2015 |
| JP | 5975556 B1 | 8/2016 |
| JP | 5999859 B1 | 9/2016 |
| JP | 2018007083 A | 1/2018 |
| KR | 20120009637 B1 | 2/2012 |
| KR | 20170018607 A | 2/2017 |
| WO | 02054480 A1 | 7/2002 |
| WO | 2012073285 A1 | 6/2012 |
| WO | 2013084298 A1 | 6/2013 |
| WO | 2013108398 A1 | 7/2013 |
| WO | 2014112041 A1 | 7/2014 |
| WO | 2015083211 A1 | 6/2015 |
| WO | 2016080162 A1 | 5/2016 |
| WO | 2017022074 A1 | 2/2017 |
| WO | 2017220245 A1 | 12/2017 |
| WO | 2018110500 A1 | 6/2018 |
| WO | 2019009381 A1 | 1/2019 |
| WO | 2019039552 A1 | 2/2019 |
| WO | 2019039568 A1 | 2/2019 |

* cited by examiner

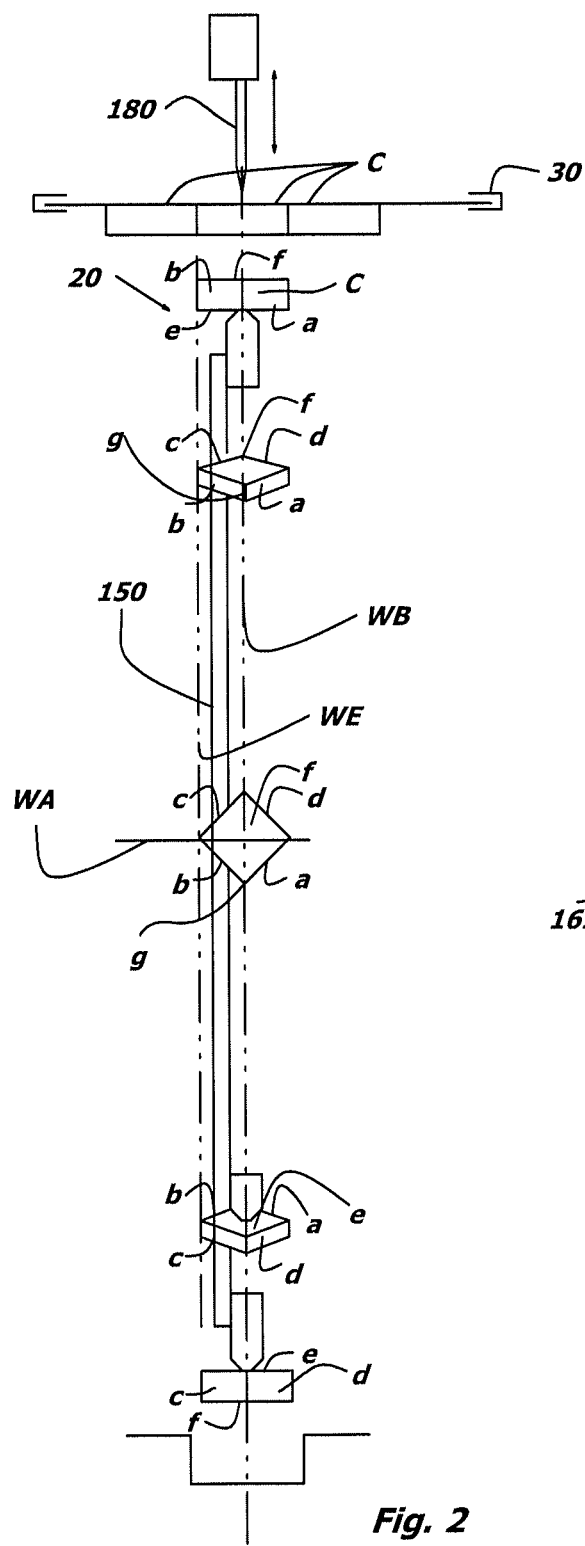
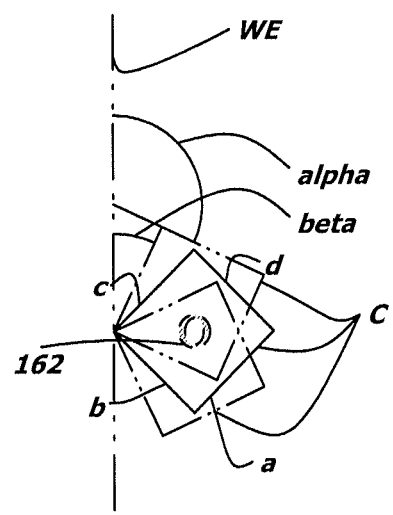
Fig. 2
Fig. 3

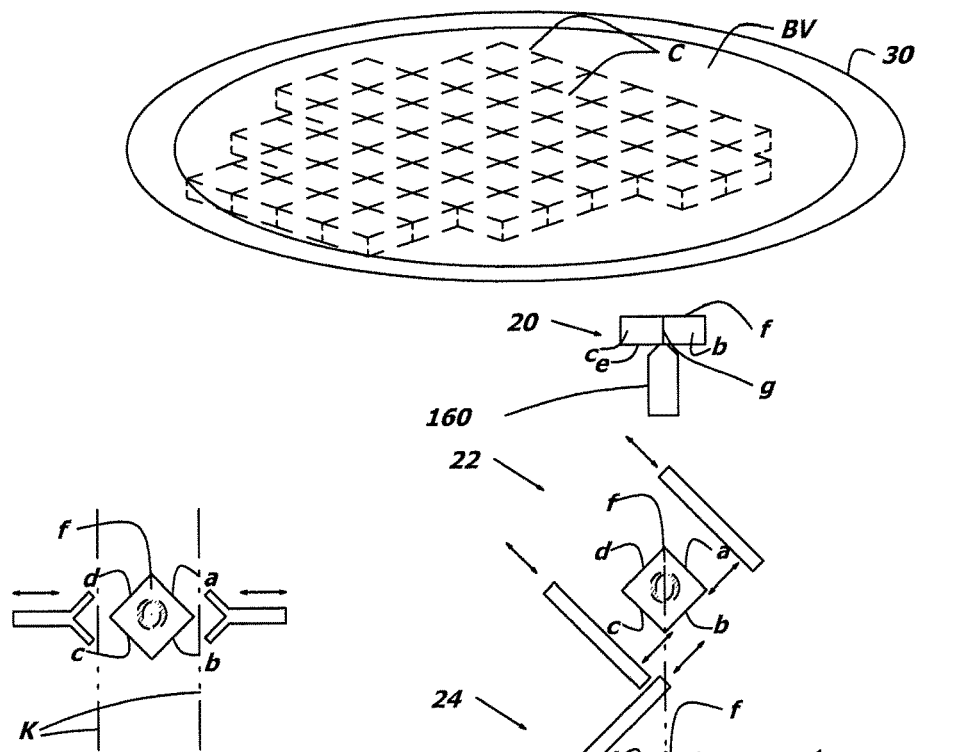
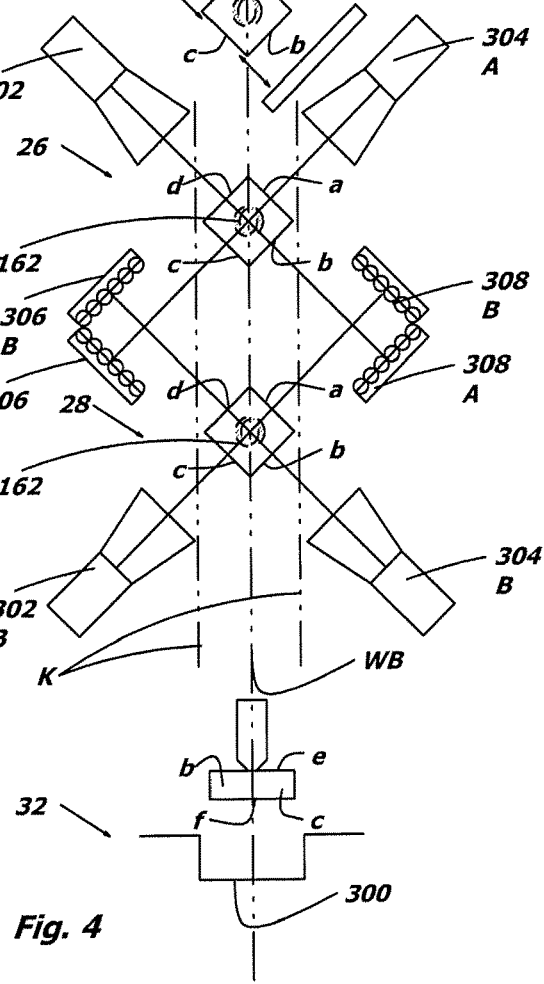
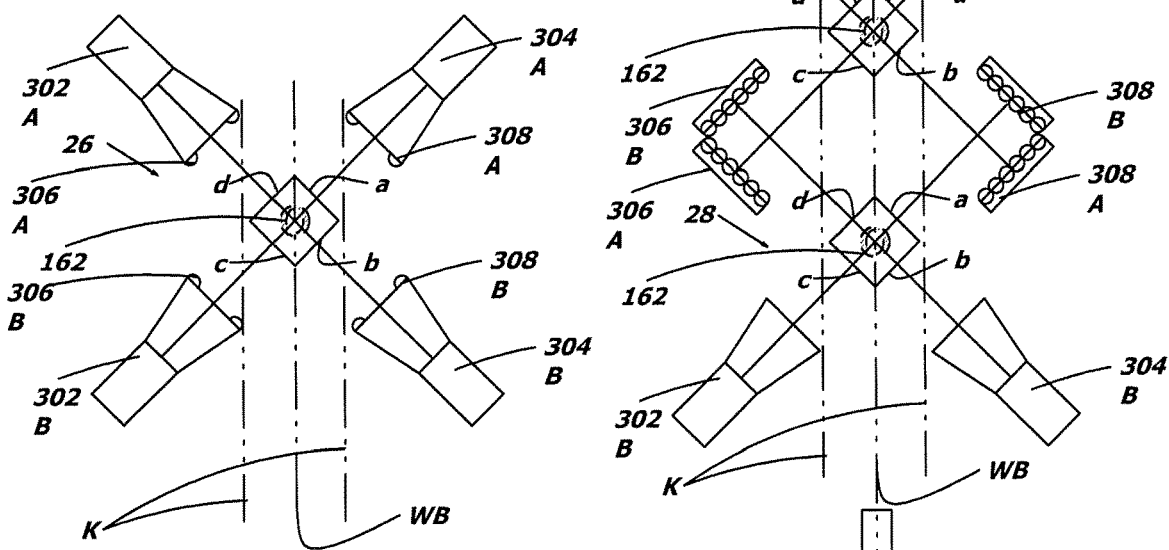
Fig. 5
Fig. 4a
Fig. 4

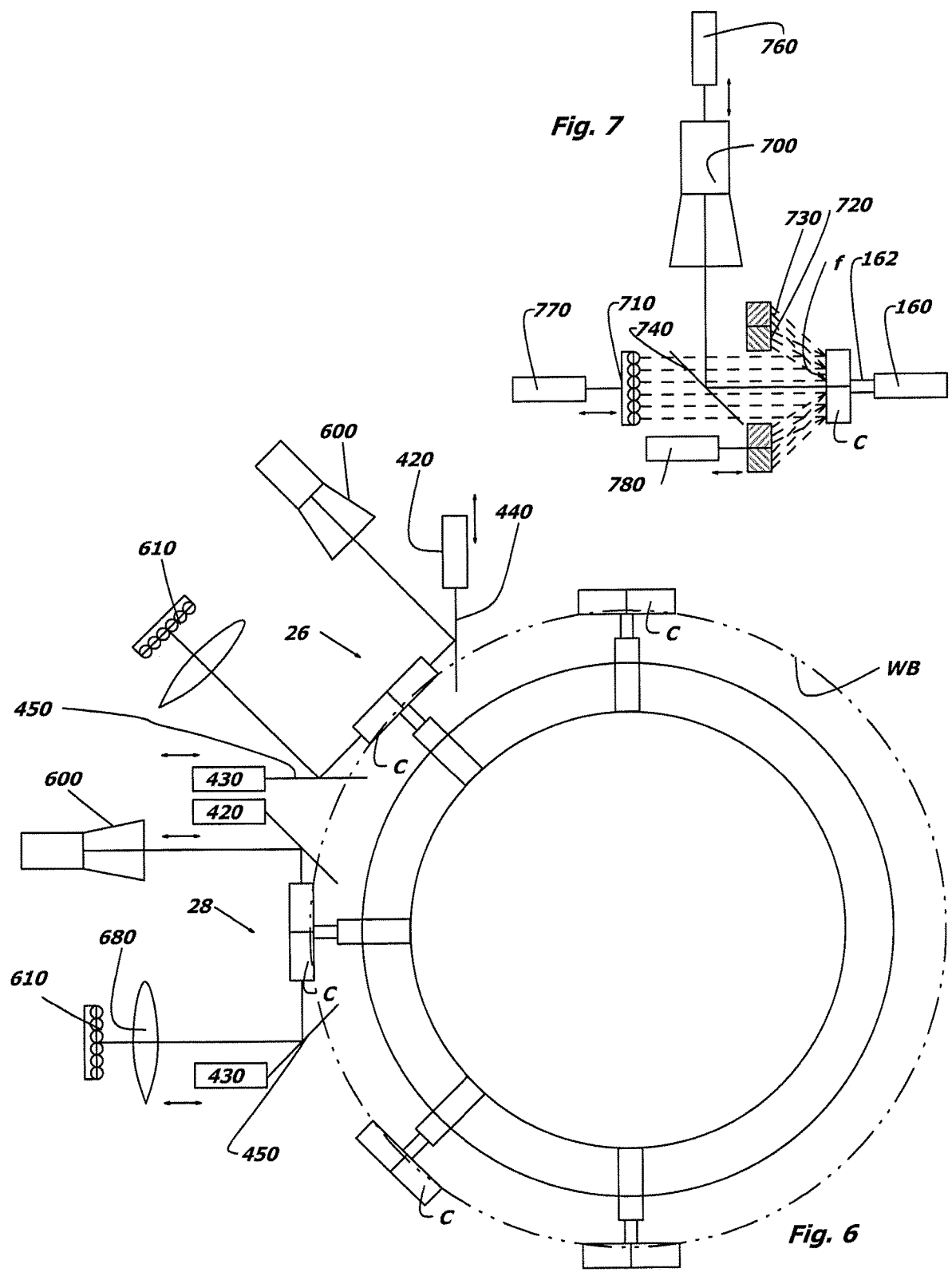

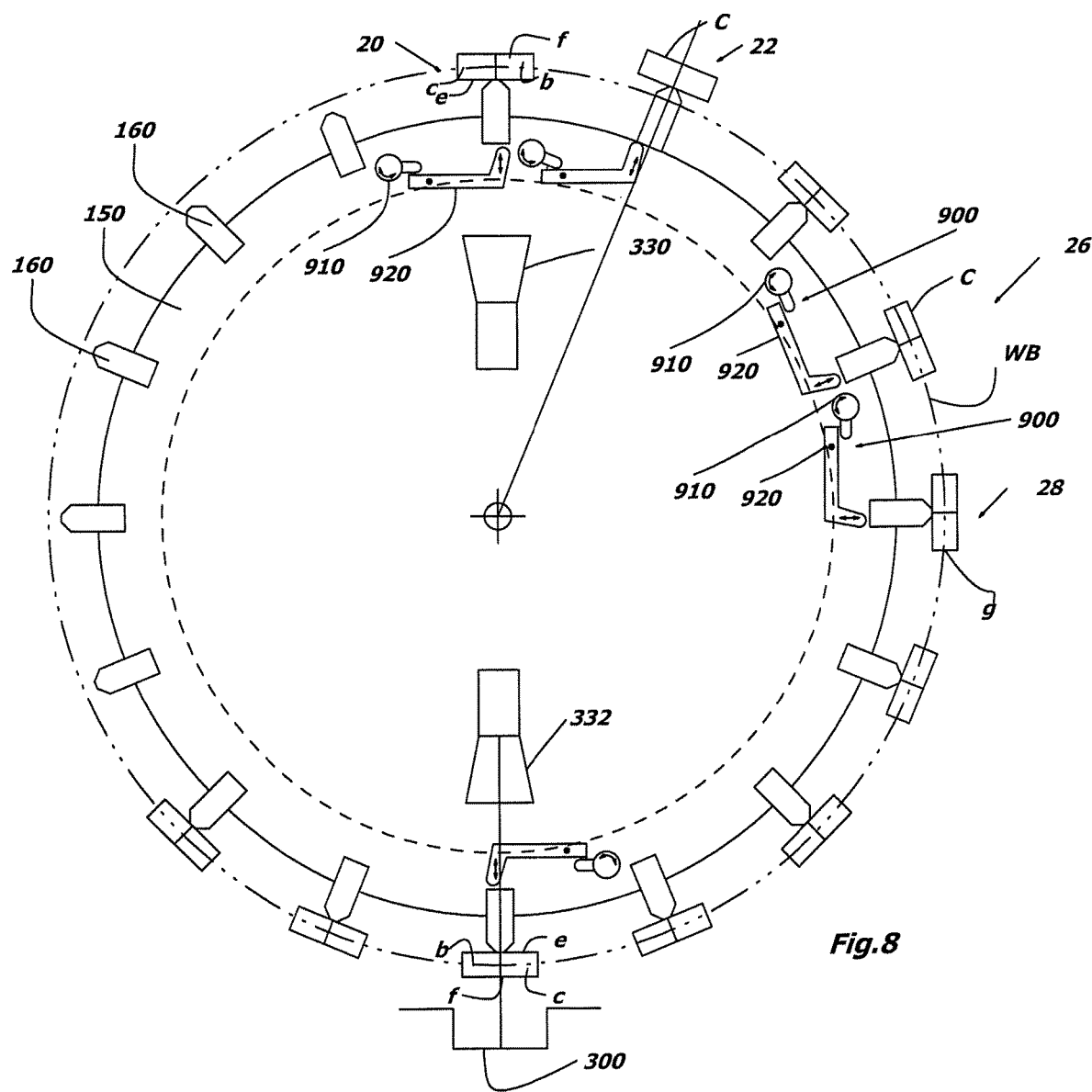

APPARATUS FOR HANDLING COMPONENTS

CROSS-REFERENCE TO RELATED APPLICATIONS

This application is a National Stage application of International Application No. PCT/EP2020/074307 filed on Sep. 1, 2020, which claims priority to German Patent Application Serial No. DE 10 2019 125 134.6 filed Sep. 18, 2019.

BACKGROUND

Field

A component handling device and a corresponding method are described herein. Details of this component handling device are defined in the claims; the description and the drawing also contain relevant information about the component handling device and the method of operation as well as variants of the component handling device.

A component inspection device and a corresponding method are also described herein. Details of this component inspection are defined in the claims; the description and the drawing also contain relevant information about the component inspection and the mode of operation as well as variants of the component inspection device.

Discussion of the Related Art

A component here is, for example, an electronic component, also referred to as a "chip" or "die". Such a component usually has a prismatic shape, a substantially polygonal, for example quadrangular (rectangular or square) cross-section with several lateral surfaces as well as a front or top surface or a top and bottom cover surface. The lateral surfaces of the component are hereinafter referred to synonymously as lateral surfaces. The component may also have a number of lateral surfaces different from four. A component may also be or comprise an electronic and/or optical component (prism, mirror, lens, etc.). Overall, a component can have any geometric shape.

So-called pick-up and set-down devices are known from the applicant's operational practice, in which components are picked up from a substrate by means of a pick-up tool and then deposited on a carrier or in a transport container or the like. Before the component is deposited, it is inspected. For this purpose, images of one or more lateral surfaces of the component are recorded with one or more cameras and evaluated by means of automated image processing.

EP 1 470 747 B1 relates to a chip removal device, a chip removal system, a placement system and a method for removing and further processing chips. The chips are removed from a wafer and transported to a transfer position and simultaneously turned. This chip removal device for removing chips from structured semiconductor wafers is equipped with a rotatable removal tool for removing the chips from the wafer and for turning the removed chips by 180° about their longitudinal or transverse axis, and a rotatable turning tool for turning the removed chips again by 180° about their longitudinal or transverse axis, which cooperates with the removal tool. The removal tool has a first transfer position and the turning tool has a second transfer position at which the chips can be transferred to a placement head for further processing.

EP 0 906 011 A2 relates to a device for removing and loading electrical components on a substrate. The device comprises a rotatable transfer device which removes the electrical components from a feed module at a pick-up position and transfers them to a suction belt for further processing at a first transfer position. By means of a rotatable placement head, the components are picked up from the suction belt and transported to a second transfer position.

WO 02/054480 A1 relates to a device for optically inspecting various surfaces of a chip to be mounted. The device comprises a first, upper transport drum, which is arranged to remove the chips from a feed unit and transport them to a first transfer position. The chips are held in suction openings formed on the peripheral surface of the upper transport drum, and moved by rotating the upper transport disk. The apparatus further comprises a second, lower transport disk formed corresponding to the upper transport disk, which receives the removed chips at the first transfer position and transports them to a second transfer position. The device enables inspection of the chips by having cameras arranged laterally adjacent to the transport discs to inspect the top and bottom surfaces of the chips. The chips are transferred unflipped relative to their original orientation to a sorting device for further processing.

U.S. Pat. No. 4,619,043 discloses an apparatus and a method for removing and placing electronic components, in particular chips, on a printed circuit board. The device comprises a transport means for picking up the chips in pick-up units and for transferring the picked-up chips to a first transfer position. The conveying means comprises a conveying chain and a rotatable sprocket wheel, which are engaged together. The apparatus further comprises a rotatable mounting tool having placement heads for picking up the chips at the first transfer position. The fastening tool is further adapted to convey the picked-up chips to a second transfer position by means of a rotary movement, whereby the chips are turned over.

JP 2-193813 relates to an apparatus for picking up and turning over electronic components inspected by inspection devices. The device comprises a feeding unit from which chip-like electronic components are taken out by a first rotating body and arranged on its circumference. A rotary motion of the rotating body transports the electronic components to a first transfer position, turning them about their longitudinal or transverse axis. The device further comprises a second rotating body, which picks up the removed electronic components at the first transfer position and transports them to a second transfer position. Thereby, a further turning of the electronic components about their longitudinal or transverse axis takes place. The device makes it possible to inspect different sides of the components.

Further technological background can be found in documents EP 3 336 024 A1, EP 1 588 402 B1, WO 2017/220 245 A1, WO 2019/039 568 A1, JP 502 94 39 A, KR 2017 001 86 07 A, JP 2018 077 083 A, JP 599 98 59 B1, U.S. Pat. No. 9,261,463 B2, WO 2018/110 500 A1, WO 2019/009 381 A1, WO 2016/080 162 A1, WO 2019/039 552 A1, KR 2012 096 37 B1, EP 2 075 829 B1, JP 59 75 556 B1, WO 2014 112 041 A1, WO 2015 083 211 A1, WO 2017 022 074 A1, WO 2013/108 398 A1, WO 2013/084 298 A1, WO 2012/073 285 A1, U.S. Pat. No. 9,510,460 B2, JP 49 11 714 B2, U.S. Pat. No. 7,191,511 B2, JP 55 10 923 B2, JP 57 83 652 B2, JP 2007 095 725 A, JP 2012 116 529 A, JP 2001-74664 A, JP 1-193630 A, U.S. Pat. No. 5,750,979, DE 199 13 134 A1, JP 8 227 904 A.

When detaching a (semiconductor) component from a substrate/wafer foil and picking up the component by the pick-up tool (for example vacuum pipette), position tolerances of the component at the pick-up tool occur. This dispersion of position and rotation of the components on the pick-up tool is influenced by a variety of parameters: Adhesion between component and substrate/wafer film, stroke height of a needle to release the component from the substrate/wafer film, position of the needle relative to the center of the component, counterforce of the pickup tool, position of the pickup tool relative to the center of the component when picking up the component, Intensity of the vacuum at the pickup tool, time available to build up the vacuum to pick up the component, nature of the surface of the component towards the pickup tool, nature of the surface of the pickup tool, etc.

Furthermore, the requirements of the industry to be able to optically detect ever smaller defects on components are increasing. Although the optical detection of defects is possible with adapted lenses and a matched illumination of the components to be inspected possible. However, the lenses available reach their limits when it comes to the necessary sharpness of reproduction and the associated decreasing depth of field. Due to the scattering of the positions of the components on the pickup tool and the shallow depth of field of the lenses, the quality of the optical inspection is limited. Defects are detected with a lower probability on out-of-focus components. This means that defective components are incorrectly not recognized as non-functional and are further processed/packaged.

Conventional solutions to this problem provide for a centering station for the component upstream of the optical evaluation to increase the quality of the optical component inspection. Here, the X and Y position and the rotation of the component are measured. Subsequently, the X and Y position and the rotation of the component are corrected by shifting and rotating the pickup tool in the X and Y direction. With this solution, each pickup tool must also be equipped with a rotary drive, or the pickup tool is designed so that a drive can engage each pickup tool. Alternatively, the pickup tool is rotated and the evaluation camera is displaced in the X and Y directions relative to the component. Another conventional variant involves placing the component on a carrier, aligning the X and Y positions and rotation of the component on the carrier, and then picking up the component again from the carrier with the pickup tool. When the component is picked up again from the carrier, there is a risk that the component will slip again relative to the pickup tool.

Systems for visual inspection of electronic components on all (four) lateral surfaces (and possibly one or both top surfaces)—see above—have either two or more cooperating transport bodies (e.g. wheels, stars, belts), or complex arrangements of imaging systems. With two or more transport bodies, the electronic components must be transferred from one to the other transport body and re-aligned for visual inspection. These solutions are costly and limited in throughput (number of electronic components inspected per time unit). The solution presented here is intended to enable improved, precise handling of components compared to the state of the art, as well as their inspection at high throughput.

SUMMARY

An apparatus and a method are disclosed herein. The device has at least one pick-up tool arranged on a turning device and is used for aligning and optically inspecting a component attached to a respective one of the pick-up tools. The pick-up tool is intended and set up to pick up the respective component on one of its top surfaces. The turning device is intended and set up to rotate the pick-up tool in a turning plane about a turning axis and to convey the component located on the pick-up tool from a pick-up position optionally into at least one orientation position, optionally into at least one inspection position, to a set-down position, and optionally into an ejection position. The device is intended and set up to handle components with several lateral surfaces to be inspected optically. For this purpose, the device has a holding and feed device facing the pickup position for a component supply. This component stock can be a (film) substrate, on whose side facing the pickup tool the components are separated from one another. A discharge device is intended and set up to convey one of the components at a time from the component stock located in the holding and feed device in the direction of or to the respective pick-up tool located in the pick-up position. The holding and feeding device is intended and set up to align all or only the respective component of the component stock to be dispensed relative to the pick-up tool located in the pick-up position in such a way that one or each lateral surface of the component to be optically inspected, which makes an acute angle with the turning plane makes an angle of about 30° to about 60° with the turning plane, or one or each lateral surface of the component to be optically inspected which makes an obtuse angle with the turning plane makes an angle of about 120° to about 150° with the turning plane. For example, the lateral surfaces of the component may be aligned with the main orthogonal alignment axes X, Y of the apparatus while the turning plane of the apparatus is oriented in or parallel to a bisector of the X, Y axes.

Such an arrangement has only one turning device, which rotates in only one turning plane. Relative to this turning plane, the component can thus be conveyed from the pick-up position to the set-down position in an angular orientation. Thus, it is possible to align the component at the pick-up tool in this angular orientation, and then to inspect it optically at its lateral surfaces/edges thereof without having to introduce a component of an optical inspection device into a turning or transport path of the component. In other words, none of the lateral surfaces of the component are oriented parallel or perpendicular to the one turning plane.

Such an arrangement also enables faster maintenance and, in particular, adjustment of the device and, in particular, of the pick-up tools immediately before the device is put into operation, since the turning device and components interacting with it are more easily accessible. Components and assemblies do not have to be removed separately for maintenance or adjustment purposes. For example, the suction pipettes of the pick-up tools need to be adjusted regularly with regard to imaging equipment or replaced due to wear or different properties of the components to be handled. This allows an overall higher throughput of components to be handled/inspired.

In addition to or instead of the pick-up position, orientation position, inspection position, set-down position, and ejection position mentioned above, other process stations are possible at other positions, for example an electrical test station or an adhesive nozzle.

The arrangement proposed here improves accessibility to the turning device, since it is practically free along its circumference. This is in contrast to known arrangements in which the component stock above the turnover device and the receiving device below the turnover device restrict access to the turnover device, the control system and the supply lines restrict access to the turnover device from the rear, and process stations arranged on the radially outer circumference of the turnover device restrict access.

The transport path of the component lies between two parallel edges of the component, which run between a lower and an upper cover surface of the component. These edges end in opposite corners of the lower and upper surfaces. These two parallel edges lie in a plane transverse to the turning plane. The transport path of the component lies in the turning plane or parallel (coplanar) to it.

In this case, a side edge of the component—oriented at least approximately parallel to the central longitudinal axis of the pick-up tool—precedes two lateral surfaces of the component adjacent to this side edge on the turning or transport path of the component along the circumference of the turning device from the pick-up position to the set-down position or to the ejection position. The angular arrangement of the lateral surfaces of the component relative to the turning plane makes it possible to inspect the lateral surfaces without having to provide a (temporary) interfering contour in the form of an inspection device or an alignment device in the turning plane and the transport path of the component.

This is in contrast to known arrangements with, for example, two turning devices offset at right angles to each other, whereby the component is transferred from one turning device to the other and the component is turned in the course of the process with respect to its front and bottom surfaces. In this known arrangement, all lateral surfaces of a component that is square in plan view are also inspected. Here, two turning planes are available due to the two turning devices. In each turning plane, only two opposite lateral surfaces can be inspected without interfering contours, since the two lateral surfaces of the components are aligned with the respective turning plane and two lateral surfaces of the components are oriented at right angles to the respective turning plane.

The pick-up tool is set up and intended to pick up a component that has four lateral surfaces to be inspected optically. Along the transport path of the component along the circumference of the turning device, two pairs of optical component inspection devices are arranged in one variant, which are arranged with their optical axis in an angular arrangement outside the transport path of the component along the circumference of the turning device. In this case, the transport path of the component is essentially circular segment-shaped (approximately semicircular from the pick-up position (0°) to the set-down position (180°), and optionally approximately three-quarter circular to the ejection position (e.g. 240° or 270°).

In the apparatus presented here, the (for example two) imaging devices and their (for example two) illumination devices (in the case of four lateral surfaces of the component to be inspected) can be arranged in an X arrangement distributed over (for example two) separate inspection positions in the same turning plane on a turning device. This reduces throughput time (and increases throughput). In this variant, transmitted-light illumination devices are a good choice.

In another variant of the X-arrangement, four imaging devices are directed at the four lateral surfaces of the component to be inspected at a single inspection position, and the imaging devices are each associated with illumination devices that illuminate the respective lateral surface to be inspected with one light spectrum or several light spectra.

The presented apparatus is also particularly advantageous for infrared transmitted light inspection with infrared (IR) illumination opposite the imaging device. This arrangement allows a reduction in cycle time, since a radial (Z) stroke of the component in the radial direction of the pick-up tool with respect to the axis of rotation of the turning device is only required at the orientation position in order to position the component at the radial (Z) stroke can be performed at the same time as the radial (Z) stroke of other components at the pickup position and/or the set-down position. This radial (Z) stroke can take place at the same time as the radial (Z) stroke of other components located on the turning device, for example at the pick-up position and/or the set-down position, since the turning device is at least briefly or approximately stationary during this time anyway.

The apparatus presented here saves space and effort, since it requires only one turning device to inspect the lateral surfaces of a component and to turn the component. The apparatus presented here is suitable for component sizes with an edge length of e.g. 0.3 mm to e.g. 12×12×2.5 mm. Thus, compared to known devices, the device presented here can handle and/or inspect a wide range of differently sized components.

The optional ejection position is used to remove a component that has been inspected as being out of order from the process, for example with an extractor.

The optional orientation position is used to correct the position and orientation of the component on the pickup tool with appropriate sliders or grippers if the component cannot be conveyed onto the pickup tool with the accuracy required for inspection. For this purpose, a device for aligning the component is intended and set up to align the component relative to a center of the pickup tool in at least one axis direction and one rotation direction. In this device, the component can be conveyed from the pick-up position to the set-down position in an angular orientation of the lateral surfaces relative to the turning plane, while the turning or transport path of the component along the circumference of the turning device is free/unaffected by components of optical component inspection equipment.

In a variant of this apparatus, two imaging devices and their illumination devices are arranged alternatively or cumulatively at each inspection position as optical component inspection devices distributed in an X arrangement in such a way that a first lateral surface of the component is to be inspected with the first illumination device and the first imaging device, and a second lateral surface adjacent to the first is to be inspected with the second illumination device and the second imaging device. The optical paths (beam paths) of the two imaging devices can cross or intersect in an X-shape at the point where the component located on the pick-up tool is positioned in the inspection position.

In a variant of this apparatus, alternatively or cumulatively, the pickup tool is configured and intended to pick up the component, which has four lateral surfaces to be optically inspected. Two pairs of optical component inspection device are disposed along the transport path of the component, the optical component inspection device being disposed in an angular arrangement outside the transport path of the component along the circumference of the turning device, the transport path being substantially circular segment shaped.

In a variant of this apparatus, an infrared (IR) illumination device opposite each imaging device is assigned alternatively or cumulatively as illumination devices for infrared transmitted light inspection, each illumination device being to be activated by a control arrangement when the pickup tool with the component is located in the detection range of the respective imaging device, or the illumination devices are permanently activated.

In a variant of this apparatus, the orientation position serves alternatively or cumulatively to correct the position and orientation of the component on the pickup tool, wherein a device for aligning the component is provided, intended and set up to align the component relative to a center of the pickup tool in at least one orientation angled to the transport path and/or in a direction of rotation relative to the central longitudinal axis of the pickup tool and/or the component.

In a variant of this apparatus, alternatively or cumulatively, the device for alignment has two slides which are movable towards and away from each other and have mutually oriented slide sections which are intended and arranged to come into contact, at least in sections, with two mutually opposite, first side or lateral surfaces of the component located on the receiving tool, in order to align the component.

In a variant of this apparatus, the slides are alternatively or cumulatively designed and arranged to slide and rotate the component toward an inspection position in a direction oriented toward at least one of the two slide sections while the pickup tool holds the component.

In a variant of this apparatus, it has 8, 16, 24, 32, 48 or more pick-up tools arranged at equal angular intervals along the circumference of the turning device, which has a circular (ring) or star shape. So far, a variant of this device with 24 pick-up tools has proven to be advantageous in terms of size, accessibility of the individual positions and speed.

In a variant of this apparatus, a stroke device is provided at the pick-up position of the component from the component stock located in the holding and feeding device, at the orientation position for centering and aligning the component on the pick-up tool, and/or at the set-down position for setting down the component, in order to effect in each case a radial (Z) stroke of the pick-up tool radially away from the axis of rotation of the turning device in the direction of the component stock located in the holding and feed device for picking up the component, of the device for centering and aligning the component, and/or of the receiving device for setting down the component.

In a variant of this apparatus, the stroke device alternatively or cumulatively has a servo motor or a cam/rocker arm arrangement at the respective position for the radial (Z) stroke in each case in order to move the pick-up tool in a controlled manner in the longitudinal direction of the pick-up tool.

In a variant of this apparatus, the turning device can be moved in a controlled manner along the turning axis of the turning device by means of a linear drive in order to receive a component at the pick-up position from the component stock with positional accuracy and/or to deposit a component at the set-down position with positional accuracy.

A method for handling components having a plurality of lateral surfaces and/or edges of the lateral surfaces has the steps: providing a component stock in a holding and feeding device for the component stock so that it faces a receiving position, conveying one of the components at a time by means of a discharge device from the holding and feeding device located in the holding and feeding device in the direction of or towards the respective pick-up tool located in the pick-up position, picking up one of the components by means of at least one pick-up tool arranged on a turning device on a top surface of the component, rotating the pick-up tool in a turning plane about a turning axis, conveying the component located on the pick-up tool from a pick-up position optionally into one or more orientation positions, optionally into one or more inspection positions, to a set-down position, and optionally into a set-down position, aligning the component stock in the holding and feeding device in such a way that at least the component to be dispensed in each case has an orientation relative to the pick-up tool located in the pick-up position, and optionally into a set-down position, and optionally to an eject position, aligning the component stock in the holding and feeding device in such a way that at least the component to be dispensed in each case, relative to the pick-up tool located in the pick-up position, a lateral surface of the component which encloses an acute angle with the turning plane encloses an angle of about 30° to about 60° with the turning plane, or a lateral surface of the component which encloses an obtuse angle with the turning plane encloses an angle of about 120° to about 150° with the turning plane.

These aforementioned lateral surfaces of the component can then be optically inspected in the inspection position(s), and/or aligned in the orientation position(s). In a further variant, a device for inspecting components with at least one top surface, several lateral surfaces to be inspected and/or edges of the lateral surfaces has at least one pick-up tool arranged on a turning device for one of the components in each case. The pick-up tool is intended and set up to pick up the respective component on its top surface. The turning device is intended and set up to rotate the component in a turning plane along a transport path about a turning axis with the pick-up tool, and in the process to convey a component located on the pick-up tool and aligned at an angle to the transport path or the turning plane into an inspection position. In the inspection position, a first and a second imaging device are arranged as optical component inspection devices at an angle to each other in such a way that a first lateral surface or edge of the component located in the inspection position is to be inspected with the first imaging device, and a second lateral surface or edge of the component located in the inspection position adjacent to the first is to be inspected with the second imaging device.

In a variant of this apparatus, two pairs of optical component inspection devices are arranged alternatively or cumulatively along the transport path of the component. These component inspection devices are each arranged in an angular arrangement outside the transport path of the component along the circumference of the turning device, whereby the transport path of the component is essentially circular segment-shaped. In one variant of this device, an infrared (IR) illumination device opposite each of the imaging devices is assigned alternatively or cumulatively as illumination devices for infrared transmitted light inspection. Each illumination device is to be activated by a control arrangement when the pick-up tool with the component is located in the detection range of the respective imaging device, or the illumination devices are permanently activated.

In a variant of this apparatus, two optical component inspection devices in the form of imaging sensors and their illumination devices with their optical paths are arranged alternatively or cumulatively at two inspection positions in an X-arrangement in such a way that the first illumination device points to the first imaging device, and the second illumination device is directed at the second imaging device. The pickup tool is adapted to convey the component to an area where the optical paths cross or intersect.

In a variant of this apparatus, alternatively or cumulatively, in each of the inspection positions, two adjacent lateral surfaces, in other words two lateral surfaces that are not parallel to each other, are to be inspected optically at the same time when the component is in the corresponding position without the imaging devices and/or their illumination devices entering the transport path of the component, or the component is to be moved radially outward or inward on the pick-up tool in order to enter the optical path of the imaging devices and their illumination devices.

In a variant of this apparatus, alternatively or cumulatively, the pick-up tool on the turning device is set up and intended to pick up the component and convey it with its lateral surfaces to be optically inspected along the transport path of the component through at least one or two of the pairs of optical component inspection devices which are set up and intended to inspect two adjacent lateral surfaces in each case.

In a variant of this apparatus, the component is to be inspected alternatively or cumulatively with transmitted light and/or with reflected light, in that an infrared (IR) transmitted light or reflected light illumination device is assigned to each of the imaging devices as illumination devices, each of which is oriented to the location at which the lateral surfaces of the component to be inspected are located in the respective inspection position.

In a variant of this apparatus, the component is alternatively or cumulatively conveyed in an angular orientation to the transport path, whereby two imaging devices and their illumination devices are provided at each of the inspection positions, each of which is assigned a deflection device for the optical beam path.

In a variant of this apparatus, the imaging devices, their illumination devices and/or the deflection devices are alternatively or cumulatively to be moved into and out of the transport path of the component by means of corresponding linear drives.

In a variant of this apparatus, the deflection devices are alternatively or cumulatively designed to be completely or partially deflecting/reflecting, and are to be retracted radially under the component to be inspected (between two adjacent pick-up tools) in the position in which they are completely retracted into the transport path of the component.

In a variant of this apparatus, an illumination device is provided alternatively or cumulatively for a reflected light imaging device for inspecting the lateral surfaces or edges of the component, relative to a lateral surface or edge of the component on the imaging device side.

In a variant of this apparatus, the imaging device and its illumination device(s), possibly with different wavelengths, and a partially translucent deflection device for the optical beam path from the imaging device to the end face of the component and/or further illumination devices surrounding the deflection device are arranged alternatively or cumulatively for an incident light imaging device for inspecting the end face of the component remote from the pickup tool and/or the position/orientation of the component on the pickup tool. This arrangement is used to inspect the position/orientation of the component on the pick-up tool. In one variant of this device, the imaging device, the illumination devices and possibly also the deflection device can be moved relative to the component alternatively or cumulatively by means of corresponding linear drives.

In a variant, this apparatus is alternatively or cumulatively equipped with two sliders that can be moved towards and away from each other and have, for example, slider sections oriented parallel to each other. These two slide sections are intended and set up to come into contact, at least in sections, with two, for example mutually opposite, first lateral surfaces of the component located on the pick-up tool, in order to align the component.

In a variant, the sliders are alternatively or cumulatively intended and arranged to push and rotate the component towards an inspection position in a direction perpendicular to at least one of the two sliding sections, for example, while the pick-up tool holds the component (for example, by means of negative pressure). At one or more successive optional orientation positions, similar devices are provided alternatively or cumulatively in each case to the first device for aligning the component, in order to align the component in further axis directions and/or rotational directions.

In a variant, the apparatus disclosed herein has 8, 16, 24, 32, 36, 48 or more pick-up tools arranged at equal angular intervals along the circumference of an annular or star-shaped turnover device.

Depending on the spatial conditions and dimensions of the individual components associated with the device (diameter of the turning device, pick-up tool, device for alignment, imaging device, etc.), for example, in a variant with 24 pick-up tools along the circumference of the turning device in a 1. position (0°) the pickup position of the component from the substrate, in a
2. position (45°) an orientation position for centering and aligning the component on the pick-up tool, in a
3. position (60°) an inspection position for checking the centering and alignment of the component on the pick-up tool, in a
4. position (90°) an inspection position for the optical inspection of two (for example adjacent) lateral surfaces of the component, in a
5. position (105°) an inspection position for optical inspection of two further (for example adjacent) lateral surfaces of the component, in a
6. position (180°) a settling position for settling the component in a container or other substrate, and in a
7. position (240°), an ejection position is provided for removing the component from the process.

The degree indications along the circumference of the turning device are to be understood as examples.

At the pick-up position of the component from the substrate, the orientation position for centering and aligning the component on the pick-up tool, and the set-down position for setting down the component, a radial (Z) stroke of the pick-up tool is effected in each case in the direction of the substrate for picking up the component, the device for centering and aligning the component, or the receiving device for setting down the component.

At the inspection positions for optical inspection, the component on the pickup tool remains in a respective radial rest position, i.e. it is not moved radially away from the axis of rotation of the turning device with a radial (Z) stroke of the pickup tool. In an apparatus of this type, linear drives are provided in one variant for the pick-up tools of the turning device.

These linear drives engage in the correspondingly positioned pick-up tools from outside the turning device and radially extend and retract the respective pick-up tool. In another variant, these linear drives merely extend the respective pick-up tool, while a return spring retracts the respective pick-up tool. In a further variant, a bidirectional or unidirectional radial drive is assigned to each of the pick-up tools.

Aligning the component to an inspection position by sliding and turning is understood here to mean that the sliding sections displace the component on the pickup tool to such an extent that the component is located as far as possible within the depth-of-field range of the respective camera arrangement in the subsequent inspection. The component does not have to be precisely aligned in both directions (X-axis and Y-axis) and in the direction of rotation (about the Z-axis). It is sufficient if the component is oriented with its lateral surfaces and top surface viewed in the respective inspection as perpendicular as possible to the optical axis of the respective camera arrangement and is completely aligned within the field of view of the respective camera arrangement.

In a variant, the first and/or the second sliders each have a drive to change the distance of the respective slider sections from the pick-up tools of the respective turnover device in radial direction with respect to the turnover axis. Thus, each slider has its own drive to change a distance of the respective slider section from a top surface of the respective pickup tools along the direction of a respective longitudinal center axis of the pickup tools. In this way, the locations at which the respective slide sections engage the sides of the components and come into contact can be adjusted.

In a further variant, the cooperating slides on the turning device are alternatively or cumulatively set up and intended to move in the same direction and at least approximately synchronously towards or away from the respective inspection position of the components. In this way, the components are pushed and turned towards the respective inspection position.

A method for inspecting components having at least one top surface, a plurality of lateral surfaces to be inspected and/or edges of the lateral surfaces comprises the steps: providing a pick-up tool arranged on a turning device for one of the components at a time, picking up a component at its top surface by means of the pick-up tool in an angled orientation to a transport path or turning plane to convey the component to an inspection position, and rotating the turning device with the pick-up tool to convey the component in the turning plane along the transport path to the inspection position, and providing in the inspection position as optical component inspection device first and second imaging means angularly disposed with respect to each other (and with respect to the in the turning plane) and inspecting a first lateral surface or edge of the component located in the inspection position with the first imaging means, and inspecting a second lateral surface or edge of the component located in the inspection position with the second imaging means.

Thus, the arrangement presented here forms an integrated handling/inspection device. Imaging sensors inspect all or almost all of the top and/or lateral surface(s) of a component and also provide relevant data on the positioning of the pickup tools (manipulators, pickup tool) and the receiving points.

This equipment thus forms a core of a closed machine system with the necessary process-technical periphery, for example for the provision of the components (for example on a wafer substrate) and component deposition (for example in a pocket or carrier belt).

The handling apparatus presented here picks up components from a component stock (wafer disk) arranged, for example, horizontally in the upper area of the handling device with a discharge device (ejector unit) that is, for example, stationary. The component stock moves in the plane relative to this ejection unit. The ejection unit uses a needle or contactless means (e.g. a laser beam) to release the components individually from the component stock and pick them up by a pick-up tool. The ejected components can be fed to several inspection processes in succession and finally deposited at the set-down position. The terms: receiving point, deposit position and (deposit) pocket are used synonymously here. Bad parts identified as such can be discharged. The optical inspection of the part integrated in the transfer process is divided into several inspection processes.

It uses one or more imaging sensors in the form of camera devices to optically detect the top and/or lateral surface(s) of a part and the positions of the pick-up tools at the receiving points. These imaging sensors are set up to capture at least one image of one of the top and/or lateral surfaces of a component in each of several inspection processes. The conveying/transport of the components takes place while the receiving tools of the turning device hold one component each. A held component passes through individual inspection processes during transport. The acquired (image) data from the imaging sensors is also used to coordinate the position control of the manipulators (pick-up tools) and the receiving points. The component conveyor is set up to convey a component along its path in a substantially continuous or clocked manner.

In a variant, the components are conveyed from a horizontally oriented component stock to a horizontally oriented deposit. It is also possible to orient the component stock and the deposit at an angle to each other, for example, to provide a horizontally oriented component stock and a vertically oriented deposit.

Furthermore, in variants of the apparatus, the holding and feeding device for the component stock and the set-down position, i.e., for example, a belt or a pallet with carrier pockets, can be controlled and moved in different (X, Y, rotation angle) directions by motor or manually. In this way, the respective component can be brought onto the pick-up tool or into the set-down position in the desired orientation and position.

The arrangement and procedure presented here can functionally combine two aspects: Handling and Inspection. These two functions can be interwoven in time and space for fast and precise qualitative assessment of several (up to six or more) sides of the components, while they are quickly taken from the component stock singly and precisely deposited at the receiving point(s) classified as good parts by inspection. The apparatus has a controlled-operation, approximately star- or wheel-shaped turning device. In one variant, the turning device has a polygonal shape. This turning device carries several pick-up tools, which in some variants can also be moved radially to the axis of rotation of the turning device, in order to feed a component fixed to a pick-up tool within a swivel angle between component pick-up and delivery to one or more process stations for positioning, inspection, rejecting bad parts and, if necessary, to further stations.

In the apparatus presented here, the star-shaped or wheel-shaped turning device carries the components on radially outward-pointing receiving tools arranged on the imaginary circumference of the turning device. This is to be seen in contrast to such devices in which the pick-up tools of the turning device are oriented parallel to its axis of rotation.

Since, depending on the number of holding tools of the turning device, several components can be held on the turning device at the same time, the inspection processes also take place simultaneously, albeit on different components.

The (upper/lower) top and/or (lateral) lateral surface(s) of a component inspected by the imaging sensors in the individual examination processes can be different top and/or lateral surfaces of the component.

One aspect of optical inspection provides for the component conveyor with a component to complete the component path with only very short downtimes in the individual positions. In this case, one or more cover and/or lateral surfaces of a component are captured with the imaging equipment during the movement or during the minimal downtimes. These images are then evaluated using image processing methods.

A variant of this optical detection/examination provides that one or more color imaging sensors or black-and-white imaging sensors are provided as imaging devices, whereby in one variant the sensors and the optical components are optimized for specific light wavelength ranges, for example infrared light or white light or UV light.

The imaging sensors may have one or more mirrors, optical prisms, lenses or the like associated with them as optical components. Radiation or light sources can be assigned to the imaging sensors. In this regard, each radiation or light source may be arranged to emit light/radiation having a different spectral or wavelength range for illuminating at least a portion of the component. The wavelength ranges may differ, overlap or coincide at least in part. For example, the light from the first light source may be red, and the light from the second light source may be blue. However, the reverse mapping or a different wavelength pairing (for example, infrared and visible light) may also be selected.

The light sources can be switched on briefly by a control arrangement in each case at the moment when the pickup tool with the component is located in the respective detection area, so that the cover and/or lateral surfaces of the component can be exposed with a brief flash of light for detection by the respective imaging sensor. Alternatively, permanent illumination can be used.

In a variant, this apparatus is assigned a dispensing device which is set up to dispense one component at a time from the structured component stock to a pick-up tool of the turning device which is positioned accordingly by the control system. This can be a component ejector, which pushes the component through the wafer carrier film by means of a needle, or a laser pulse generator, which specifically reduces the adhesive force of the component on the carrier film and thus detaches the component from the carrier film. A position and/or property sensor is assigned to the dispensing device as an imaging device, which is set up to determine the position of the dispensing device relative to the component to be dispensed and/or position data of the component to be dispensed, and/or properties of the component to be dispensed and make them available to the control system for actuating the dispensing device.

In the apparatus, in one variant, the pick-up tools of the turning device are set up to be extended and retracted in a controlled manner radially to the axis of rotation or the center of rotation of the turning device, and/or to be subjected to negative pressure and/or positive pressure in a controlled manner for receiving and delivering a component to be conveyed, and/or to be immovable about their respective radial axis of movement, or to be rotated about their respective radial axis of movement through an angle of rotation in a controlled manner.

In a variant of this apparatus, valves provide a supply of negative pressure and positive pressure to each of the individual pick-up tools individually and in accordance with the position in order to freely or position-controlled perform the functions of: (i) suction of the component, (ii) holding of the component during handling at the turning device, in particular also during centering and alignment of the component at the pick-up tool and subsequent inspection, (iii) depositing of the component with or without controlled blow-off pulse, and/or free blow-off of the component.

In a variant of this apparatus, position and property sensors in the form of imaging optical inspection devices are assigned to the turning device between the pickup position and the deposit point. These sensors are set up to record position data and/or properties of the conveyed component and/or position data for position control of the pick-up tools and the deposit point and to make them available for the control system.

In a variant of this apparatus, at least some of the position and property sensors are set up to inspect at least one top surface and/or one or more lateral surfaces of the conveyed component in each case in order to record its position data and/or properties and make them available for the control system. In one variant of the component handling device, an integer number of n pick-up tools are assigned to the turning device. Here, $n \geq 2$.

In a variant of this apparatus, the position/property sensors are imaging sensors with matching or differing detection spectra, or contacting or non-contacting distance-measuring position sensors, or contacting or non-contacting detection property sensors.

The position and property sensors can be imaging sensors with straight-line optical axes or optical axes bent by optical lenses, mirrors, prisms, or gratings.

The imaging sensor systems of the position and property sensors including their mirror and illumination units can be combined by their spatial arrangement in such a way that the component inspection of two lateral surfaces can be realized in parallel at a single process position. In this way, two process positions on the turning device are sufficient for the complete inspection of four lateral surfaces of a cuboid-shaped component, for example. In a third process position on the turning device, the top surface of the component remote from the pickup tool can be inspected; an additional imaging sensor can be used to inspect the correct position of the component at the receiving point.

The variants presented here are more cost-effective compared to the state of the art and offer higher component throughput, more time for inspections, and have fewer moving masses.

BRIEF DESCRIPTION OF THE DRAWINGS

Further features, characteristics, advantages and possible variations will become clear to a person skilled in the art from the following description, in which reference is made to the accompanying drawings. Here, Figs. schematically show an optical inspection device for a component.

FIGS. 1a, 1b illustrate an (electronic) component with a prismatic, rectangular cuboid shape in plan view with four lateral surfaces as well as a lower and an upper cover surface.

FIG. 2 illustrates how several pick-up tools on the turning device rotate in a turning plane about a turning axis and convey a component located on the respective pick-up tool from a pick-up position to one or more orientation positions, one or more inspection positions, to a set-down position, and to an ejection position.

FIG. 3 illustrates three variants of an angular orientation of the component with respect to the turning plane.

FIG. 4 illustrates how the pickup tool picks up the component and conveys it with its four lateral surfaces to be optically inspected along the transport path through two pairs of optical component inspection devices to two inspection positions.

FIG. 4a illustrates how the component on the pickup tool with its four lateral surfaces to be inspected optically is to be inspected at a single inspection position by two pairs of optical component inspection devices.

FIG. 5 illustrates a device for alignment with two V-shaped sliders, which are fed laterally from outside onto two opposite corners of the component C. The sliders are then moved to the opposite corners.

FIG. 6 illustrates how the component is conveyed from the pick-up position to the set-down position in an orientation that is angled relative to the transport path, and two imaging devices and their illumination devices are provided at each of the two inspection positions.

FIG. 7 illustrates how a reflected light image can be used to inspect an end face of the component as well as its position/orientation on the pickup tool.

FIG. 8 illustrates a stroke device provided at the pick-up position of the component, at the orientation position, and at the set-down position.

DETAILED DESCRIPTION OF THE EMBODIMENTS

Figure 1:
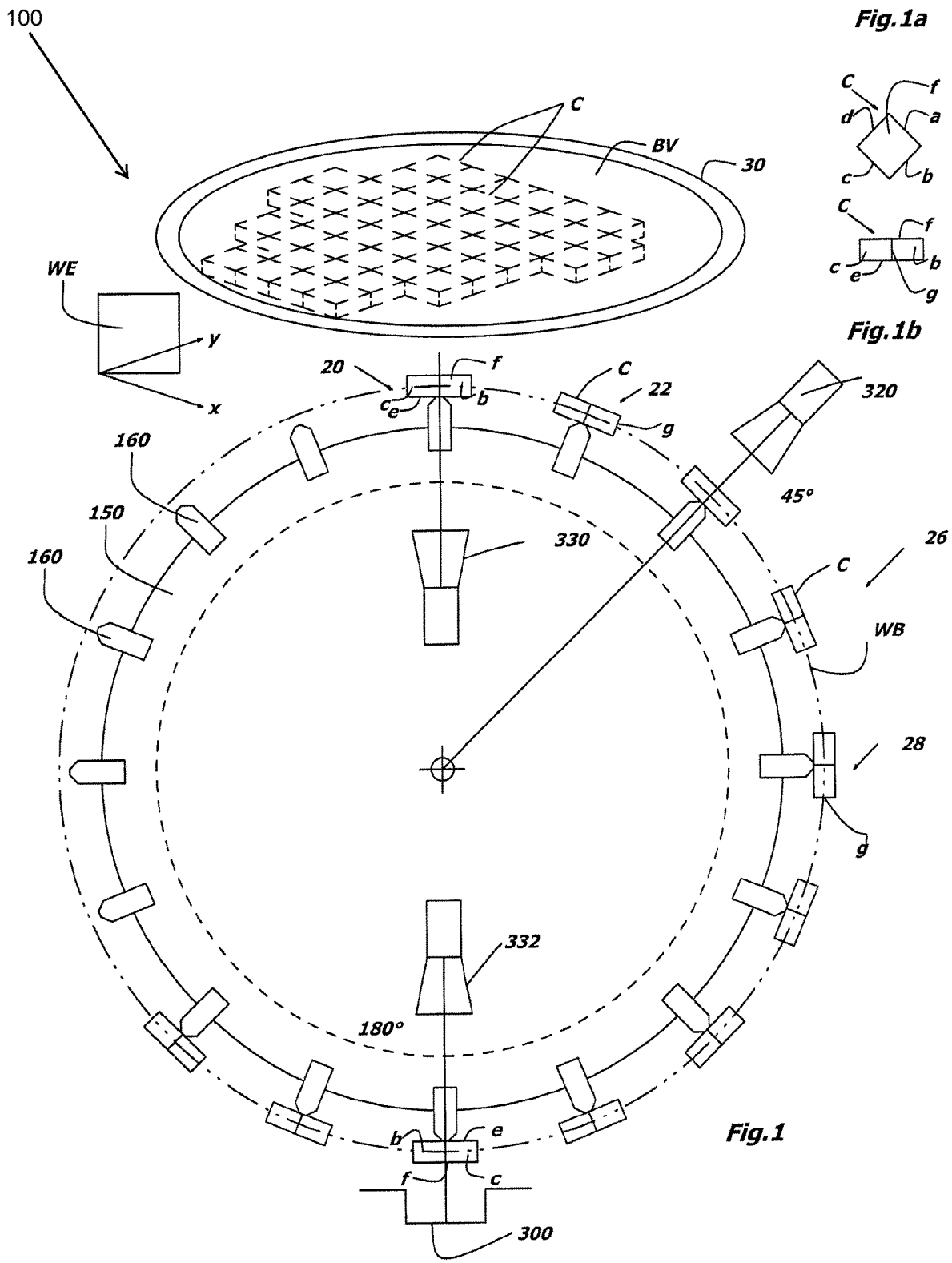
FIG. 1 shows a schematic side view of a device for handling a component that is conveyed from a pick-up position to a set-down position by means of a turning device.

FIG. 1 illustrates a component handling apparatus 100 for removing prismatic components C in the form of electronic semiconductor chips from a component stock BV and for depositing them at a receiving device 300, which may be designed, for example, as a pocket or carrier tape, as a (foil) substrate or as a pallet with (deposit) pockets arranged in a plurality of rows and columns. The component handling apparatus 100 presented here receives the components C in a receiving position 20 from a component stock BV arranged horizontally in the upper region of the component handling device 100, here in the form of a wafer disc, which is received in a holding and feeding device 30 facing the receiving position 20.

In the illustrated variant, see also FIGS. 1a, 1b, a component C is an electronic component with a prismatic, quadrangular shape in plan view with four lateral surfaces a, b, c, d as well as a lower and an upper cover surface e, f of the component C. The upper and lower cover surfaces e, f of the component C are of a prismatic shape.

The component handling apparatus 100 has a turning device 150 in the form of a turning wheel. At the radially outer edge region of the turning device 150, a plurality of (in the variant shown 16, but there may also be, for example, 8, 24, 32 or another number) pick-up tools 160 are arranged at equal angular intervals along the circumference of the turning device 150, which has a circular ring or star shape.

Each of the pick-up tools 160 serves to pick up one of the components C at its top surface e in the pick-up position 20 from the component stock BV. The turning device 150 has a motor drive 170 for rotating the turning device 150 in a turning plane WE about a turning axis WA. In this case, the turning plane coincides with the plane in which the pick-up tools 160 rotate. The turning axis WA coincides with the center axis of the wheel-shaped turning device 150. In the variant shown, a component C located at the pick-up tool 160 is conveyed during rotation from the pick-up position 20 to one or more, here one, orientation positions 22, 24, one or more inspection positions 26, 28, to a set-down position 32, and optionally to an ejection position 34.

For this purpose, the pick-up tools 160 are arranged facing radially outward on the (imaginary) circumference of the star-shaped or wheel-shaped turning device 150 and carry the components C. In the variant shown, the pick-up tools 160 can be moved radially with respect to the turning axis WA of the turning device 150. Thus, these pick-up tools 160 can pivot and convey the components C, each fixed to one of the pick-up tools 160, within a pivot angle—here between 0° and 180°—between the pick-up position 20 and the set-down position 32 (or up to the ejection position 34).

In the variant shown, a discharge device 180 comprises a needle controlled by a control system or operates, for example, in a non-contact manner with a laser beam to release the components C individually from the component stock BV to be fed to the turning device 150. Each of the pick-up tools 160 is arranged, when it is closest to the discharge device 180 at the 0° position of the turning device 150, to receive a component from the component stock BV at the pick-up position 20. Thus, the discharge device 180 conveys one of the components C at a time from the component stock BV located in the holding and feeding device 30 to the respective pick-up tool 160 located in the pick-up position 20.

The holding and feeding device 30 is rotatably mounted about its central longitudinal axis in such a way that, from the component stock BV, the respective component C to be dispensed can be aligned relative to the receiving tool 160 located in the receiving position 20 in such a way that a optically inspectable lateral surface a, b, c, d of the component C, which encloses an acute angle with the turning plane WE, encloses an angle alpha of about 30° to about 60° with the turning plane WE, or an optically inspectable lateral surface of the component C, which encloses an obtuse angle with the turning plane WE, encloses an angle beta of about 120° to about 150° with the turning plane WE. This is illustrated in FIG. 3, which shows three variants of a position of component C with the indicated angular ranges relative to the turning plane WE.

In other words, a side edge g of the component C oriented substantially perpendicular to the top or bottom surface of the component C precedes two lateral surfaces a, b of the component C adjacent to the side edge g on the turning or transport path WB of the component C along the circumference of the turning device 150 from the pick-up position 20 to the set-down position 32 (or to the ejection position 34). This is illustrated in FIG. 2.

This ensures that the lateral surfaces of the component C to be inspected optically do not lie in an orientation transverse to the turning plane WE along the circumference of the turning device 150. Thus, the inspection of the lateral surfaces of the component C to be inspected can be carried out without the imaging devices and their illumination devices having to enter the transport path WB or the transport path of the component C, or without the component C having to be moved radially outward or inward at the pick-up tool 160 in order to enter the optical path of the imaging devices and their illumination devices. Nevertheless, (for example in the case of a component C with four lateral surfaces) all four lateral surfaces can be inspected during the transport path of the component C from the pick-up position 20 to the set-down position 32 at the one (um) turning device 150. This is not possible with previously known devices, which require two mutually orthogonally oriented turning devices, in which the component is transferred from one to the other turning device.

For suction of the component C in the pick-up tool 160, for holding the component C on the pick-up tool 160, for depositing the component C with or without controlled blow-off impulse, and for free blow-off of the component C from the pick-up tool 160, the pick-up tools 160 are connected to a pneumatic unit not further illustrated. The pneumatic unit, controlled by the controller, applies positive or negative pressure to the individual pick-up tools 160 in a valve-controlled manner at the respective time or period required in order to pick up, hold and release the components C individually.

FIG. 1 illustrates an imaging device 320 (at 45°) that can be used to detect the position/orientation of the component C at the receiving tool 160 and evaluate it in the control system before the component C is conveyed to the inspection position(s) 26, 28. FIG. 1 also shows an imaging device 332 (at 180°) that can be used to detect the position/orientation of the component C at the receiving device 300 and evaluate it in the control system, and an imaging device that can be used to detect the position/orientation of the component C at the receiving position and evaluate it in the control system.

In the variant illustrated here, the component C is conveyed from the pick-up position to the set-down position 32 in an angular orientation of 45° or 135° (± about 30°) of the lateral surfaces a, b, c, d relative to the turning plane WE. In this case, the turning or transport path WB of the component C along the circumference of the turning device 150 is free/unaffected by components of optical component inspection devices.

FIG. 4 illustrates how two optical component inspection devices 302A, 302B, 304A, 304B in the form of high-resolution (in one variant 4-12 megapixel) imaging sensors and their illumination devices 306A, 306B, 308A, 308B (in one variant an IR light-emitting diode arrangement) are arranged in an X-arrangement for transmitted light inspection at each of two successive inspection positions 26, 28. Here, in the first inspection position 26, a first illumination device 306A is directed to a first imaging device 304A, and a second illumination device 308A is directed to the first imaging device 302A. In the second inspection position 28, a second illumination device 306B is directed at a first imaging device 304B, and a second illumination device 308B is directed at the second imaging device 302B.

Thus, in each of the two successive inspection positions, two lateral surfaces can be inspected optically at the same time when the component C is at the corresponding position, without the imaging devices and their illumination devices having to enter the transport path of the component C, or the component C having to be moved radially outward or inward on the pick-up tool 160 in order to enter the optical path of the imaging devices and their illumination devices.

In particular, FIG. 4 shows how the pick-up tool 160 picks up the component C at the turning device 150 and passes its four lateral surfaces a, b, c, d to be optically inspected along the transport path WB of the component C along the circumference of the turning device 150 through two of the pairs of optical component inspection tools described above. These are arranged in an angular arrangement outside the substantially circular-segment-shaped transport path WB of the component C of the turning device 150. At each inspection position 26, 28, one of the pairs of imaging devices 302A, 304A, 302B, 304B and their illumination devices 306A, 308A, 306B, 308B is arranged and inspects two adjacent lateral surfaces a, b, c, d, respectively.

Thus, at the first inspection position 26, the first pair of imaging devices 302A, 304A and their illumination devices 306A, 308A inspect the adjacent lateral surfaces d and a of the component C in transmitted light, and at the second inspection position 28, the second pair of imaging devices 302B, 304B and their illumination devices 306B, 308B inspect the adjacent lateral surfaces c and b of the component C in transmitted light.

In a variant of the apparatus, to further reduce cycle time, the first pair of imaging devices 302A, 304A and the second pair of imaging devices 302B, 304B may each be associated with a separate image data processing device for evaluating acquired image data of the lateral surfaces of component C, which may be connected to a central machine control device.

In the variant shown, the component C is inspected in transmitted light (with infrared light). In this case, an arrangement for inspection with reflected light is also possible in addition or instead, in which the illumination devices 306, 308, for example, surround the imaging devices 302, 304 in an annular manner or are designed as an array (LEDs) emitting two different wavelengths and are oriented to the location at which the lateral surfaces a, b, c, d to be inspected are located in the respective inspection position 26, 28.

Here, the pairs of optical component inspection devices are each arranged at the edge outside a corridor bounded by two lines K in FIG. 4.

Thus, infrared (IR) and/or reflected light illumination devices 306, 308 are associated with each of the imaging devices 302, 304 as illumination devices for infrared transmitted light inspection and/or reflected light inspection. Each illumination device 306, 308 is to be activated by a control arrangement which also synchronizes an image acquisition by the imaging devices 302, 304 when the pickup tool 160 with the component C is in the detection range of the respective imaging device 302, 304. In another variant, the illumination devices 306, 308 are permanently activated.

Before the component C is inspected optically, in a variant, provision is made for correcting the position and orientation of the component C on the pick-up tool 160 in one or more orientation positions 22, 24, or for orienting it appropriately for the subsequent inspection. In the variant illustrated in FIG. 4, a device 400 for orienting the component C serves to orient the component C relative to a center of the pick-up tool 160, in this case the central longitudinal axis of a suction pipette 162 of the pick-up tool 160 in an orientation angled to the transport path WB, in the variant shown 45° or in a direction of rotation relative to the central longitudinal axis of the pick-up tool 160. For this purpose, in the variant shown in FIG. 4, at the two orientation positions 22, 24 for the component C, each oriented at an angle to the transport path WB (about 45° and 135°±about 30°, respectively), the devices for aligning 400 are arranged, each having two slides movable toward and away from each other. Each of the slides has a slide section oriented towards the other in order—when the slides are closed—to come into contact with two opposing lateral surfaces of the component C located on the receiving tool 160. This aligns the component C for inspection.

Provided that the component C is aligned in two orientation positions 22, 24, the focusing effort of the imaging devices and/or their illumination devices is reduced in the two subsequent inspection positions. In another variant, it is envisaged to align the component C in only one direction at an angle to the transport path WB, then to detect the position of the component C relative to the pick-up tool 160 or its suction pipette 162 by means of a radially outer imaging device 320, optionally also to detect the properties of the top surface of the component C lying away from the pick-up tool, and to determine the focusing paths of the imaging devices 302, 304 in the subsequent inspection positions 26, 28 and/or their illumination devices 306, 308.

Based on these determined focusing paths, the imaging devices 302, 304 and/or their illumination devices are then moved by a controller to focus in one of the subsequent inspection positions or in both of the subsequent inspection positions before/when/during/after the component C moves to the corresponding inspection position 26, 28. In a further variant not illustrated, no orientation position at all is provided to which the component C is to be aligned. Rather, the position of the component C taken over from the component stock BV, possibly with a twist of a few degrees and a few $1/100$ mm up to a few mm, is directly detected by means of a radially outer imaging device 320 and from this the focusing paths of the imaging devices 302, 304 and/or their illumination devices 306, 308 in the two subsequent inspection positions 26, 28 is determined accordingly. Subsequently, with a control, the imaging devices and/or their illumination devices are then moved to focus before/when/during/after the component C reaches the corresponding inspection position 26, 28.

Provided that at least one alignment device 400 is provided with the two slides 402, 404 movable towards and away from each other, the slides 402, 404 serve to push and/or rotate the component C towards an inspection position in a direction oriented towards at least one of the two sliding sections 406, 408, while the pick-up tool 160 holds the component C.

FIG. 4 a illustrates in a further variant of an X-arrangement how at a single inspection position 26 four imaging devices 302A, 304A, 302B, 304B are directed at the four lateral surfaces a, b, c, d, of the same component C to be inspected. The imaging devices 302A, 304A, 302B, 304B are respectively associated with illumination devices 306A, 306A, 308B, 308B, which illuminate the respective lateral surface a, b, c, d, of the component C to be inspected with one light spectrum or several different light spectra in incident light. Thus, an image acquisition of the respective lateral surface by the respective imaging device 302A, 304A, 302B, 304B is possible.

FIG. 5 illustrates a variant in which two essentially V-shaped slides 410, 412 are fed laterally from outside the corridor bounded by two lines K to two opposite corners of the component C, which is square in the example. In this case, the component C is aligned parallel to both legs of the slides 410, 412 and centrically to the suction pipette 162 of the pick-up tool 160.

FIG. 6 illustrates a variant in which the component C is conveyed from the pickup position of the component C to the set-down position 32 of the component C in an angular orientation with respect to the transport path WB (its lateral surface facing the transport path WB encloses an angle of, for example, about 45°± about 30° with the latter), and two imaging devices 600 and their illumination devices 610 are provided at each of the two inspection positions 26, 28 (only one of which is shown in FIG. 6 for the sake of clarity). The imaging devices 600 and their illumination devices 610 are each assigned a deflection device 440, 450 for the optical beam path, here in the form of a mirror, which are to be moved into and out of the transport path WB of the component C by the control system by means of corresponding linear drives 420, 430. Thereby the mirrors or prisms are completely or partially deflecting/reflecting and, in the position in which they are fully inserted into the transport path WB of the component C, extend radially under the component C between two adjacent pick-up tools 160. The illumination devices 610 can also each be assigned a converging lens 680, if necessary. The variant illustrated in FIG. 6 permits a transmitted light image for inspecting the lateral surfaces of the component C by means of infrared light. For a reflected light image for inspecting the lateral surfaces of the component C, instead of the illumination devices 610 or in addition to the illumination device 610, an illumination device, for example in the form of an illumination ring around the lens or its beam path, can be provided on the side of the component C facing away from the imaging device, which is directed onto the lateral surface or edge of the component C to be inspected. Thus, in one variant, the lateral surface can be illuminated with visible light, for example blue light, which is reflected at the lateral surface and is detected by the imaging device.

The variant illustrated in FIG. 7 permits reflected light imaging for inspecting the front surface f of the component C lying off the suction pipette 162 of the pickup tool 160, as well as the position/orientation of the component C on the suction pipette 162 of the pickup tool 160. In this variant, the imaging device 700 has illumination devices 710, 720, 730 with different wavelengths (here, infrared, red, blue) and a deflection device 740 in the form of a mirror 750 that is partially transparent to illumination light from the illumination device 710 for the optical beam path from the imaging device 700 to the front surface f of the component C. The further illumination devices 720, 730 are to be provided optionally, provided that the illumination device 710 supplies light of a visible wavelength only, and may be arranged as illumination rings surrounding the deflection device 740. By means of corresponding linear drives 760, 770, 780, in one variant the imaging device 700, the illumination devices 710, 720, 730 and, if necessary, also the deflection device 740 are to be moved relative to the component C by the control system.

If necessary, in a variant—see also FIG. 8—a stroke device 900 is provided at one or more of the following positions, namely at the pick-up position 20 of the component C from the component stock BV located in the holding and feeding device 30, at the orientation position 22 for centering and aligning the component C on the pick-up tool 160, and at the set-down position 32 for setting the component C down. This stroke device 900 is used in each case to execute a radial (Z) stroke of the pick-up tool 160 radially away from the axis of rotation DA of the turning device in the direction of the component stock BV located in the holding and feed device 30 for picking up the component C, the device to center and align the component (C), and/or the receiving point 32 of the component C. In the variant shown, the stroke device 900 for the radial (Z) stroke has a respective cam/rocker arm arrangement 910, 920 at the respective position to move the receiving tool 160 radially outward in a controlled manner in the longitudinal direction of the receiving tool 160. The return movement of the pickup tool 160 is implemented by a spring arrangement not further illustrated. Alternatively, a servomotor may be provided in each case. In this case, the lifting movement is dimensioned such that the component C on the receiving tool 160 is lifted out of the other transport path WB. A rotary drive for the cam/rocker arm arrangement 910, 920 rotates the cam 910 about an axis of rotation oriented parallel to the turning axis WA of the turning device 150. Through this rotary movement, the cam 910 actuates the rotatably mounted rocker arm 920, the end of which facing away from the cam 910 is formed as a plunger. The return movement of the rocker arm 920 can also be implemented by a spring arrangement. It is advantageous if the cam/rocker arm arrangement 910, 920 and its rotary drive are arranged on a side of the turning device 150 facing the motor drive 170 of the turning device 150.

In a variant, the present arrangement has only one turning device with, for example, 24 pick-up tools. The turning device is rotated by 45° (or in a range between 30°-60°) to the X, Y main axes. In this variant, the component stock is arranged above the turning device and the deposit below it.

The inspection system with (four) imaging sensors, beam deflectors (mirrors) for lateral surface inspection of the components at two inspection positions is able to directly inspect the lateral surfaces at two non-parallel edges each and without a Z-stroke of the pick-up tools during a rotation or movement of the turning device. The absence of a Z-stroke on the pick-up tools in the inspection position for the lateral surfaces can lead to time savings and thus more component throughput.

The variants of the apparatus described above, as well as its construction and operating aspects, are merely intended to provide a better understanding of the structure, operation and features; they do not limit the disclosure to the variants, for example. The Figs. are partially schematic, with significant features and effects shown, in some cases significantly enlarged, to illustrate the functions, operating principles, technical variants and features. In this regard, each mode of operation, principle, technical variant and feature disclosed in the Fig. or in the text can be combined with all claims, each feature in the text and in the other Fig., other modes of operation, principles, technical variants and features contained in or resulting from the present disclosure may be freely and arbitrarily combined so that all conceivable combinations are attributable to the described procedure. Combinations between all individual variants in the text, i.e., in each section of the description, in the claims, and also combinations between different variants in the text, in the claims, and in the Figs. are included. Also, the claims do not limit the disclosure and thus the possible combinations of all disclosed features with each other. All disclosed features are also explicitly disclosed herein individually and in combination with all other features.

The invention claimed is:

1. An apparatus for handling components, wherein
the apparatus is set up to handle the components with several lateral surfaces and/or edges of the lateral surfaces,
the apparatus has at least one pick-up tool, arranged on a turning device, for one of the components, where the at least one pick-up tool is set up to receive a respective one of the components at a surface of the one component,
the turning device is set up to,
rotate the at least one pick-up tool in a turning plane about a turning axis, and
to convey the one component located on the at least one pick-up tool from
a pick-up position optionally into
one or more orientation positions, optionally into
one or more inspection positions, to
a set-down position, and optionally into
an ejection position, whereby
the apparatus comprises a holding and feeding device for a component stock facing the pick-up position, wherein
a discharge device is set up to convey one of the components at a time from the component stock located in the holding and feed device towards or to the at least one pick-up tool located in the pick-up position, and
the holding and feeding device is set up to align from the component stock to at least the one component to be dispensed relative to the at least one pick-up tool located in the pick-up position in such a way that
a lateral surface of the one component, which encloses an acute angle with the turning plane, encloses an angle of about 30° to about 60° with the turning plane, or
a lateral surface of the one component, which encloses an obtuse angle with the turning plane, encloses an angle of about 120° to about 150° with the turning plane, characterized in that
the turning device is further set up to convey the one component from the pick-up position to the set-down position in an angular orientation of the lateral surfaces relative to the turning plane, and wherein
a component inspection device is set up to inspect the one component conveyed by the turning device with the angular orientation of the lateral surfaces relative to the turning plane in one of the inspection positions.

2. The apparatus for handling components according to claim 1, wherein at each inspection position, as an optical component inspection device, first and second imaging devices and first and second illumination devices are distributed in an X arrangement in such a way that a first lateral surface of the one component is inspected with the first illumination device and the first imaging device, and a second lateral surface of the one component adjacent to the first lateral surface of the component is inspected with the second illumination device and the second imaging device.

3. The apparatus for handling components according to claim 2, wherein as illumination devices for an infrared transmitted-light inspection the imaging devices are each assigned an infrared illumination device opposite the imaging devices, wherein the illumination devices are activated by a control arrangement when the at least one pick-up tool with the one component is located in the detection range of the imaging devices, or the illumination devices are permanently activated.

4. The apparatus for handling components according to claim 1, wherein the at least one pick-up tool is adapted and set up to pick up a component having four lateral surfaces to be optically inspected, and along a transport path of the one component two pairs of optical component inspection devices are arranged in an angular arrangement outside the transport path of the one component along a circumference of the turning device, the transport path of the one component being substantially circular segment-shaped.

5. The apparatus for handling components according to claim 1, wherein the one or more orientation positions serves to correct a position and orientation of the one component on the at least one pick-up tool, wherein a device for aligning the one component is provided and set up to align the one component relative to a center of the at least one pick-up tool in at least one orientation angled to the transport path and/or in a direction of rotation relative to a central longitudinal axis of the at least one pick-up tool.

6. The apparatus for handling components according to claim 5, wherein the device for aligning the one component comprises two sliders which are movable towards and away from each other and which comprise mutually oriented slider sections which are arranged to come into contact, at least in sections, with two mutually opposite, first side or lateral surfaces of the one component located on the at least one pick-up tool, in order to align the one component.

7. The apparatus for handling components according to claim 6, wherein the sliders are arranged to move the one component in at least one of the following ways, one of the two sliding sections toward an inspection position and rotate the one component while the at least one pick-up tool holds the one component.

8. The apparatus for handling components according to claim 1, the apparatus comprising 8, 16, 24, 32, 48 or more pick-up tools arranged at equal angular intervals along the circumference of the turnover device, which has a circular ring or star shape.

9. The apparatus for handling components according to claim 1, wherein at
the pick-up position of the one component from the component stock located in the holding and feeding device,
the one or more orientation positions for centering and aligning the one component on the holding tool, and/or
the set-down position for setting down the one component,
a stroke device is provided to effect a radial move of the at least one pick-up tool away from an axis of rotation of the turnover device in a direction of
the component stock located in the holding and feeding device to pick up the one component,
the device for centering and aligning the one component, and/or
the at least one pick-up tool to set down the one component.

10. The apparatus for handling components according to claim 9, wherein the stroke device for the radial stroke comprises a servo motor or a cam/rocker arm arrangement at the respective position in order to move the at least one pick-up tool in a controlled manner in a longitudinal direction of the at least one pick-up tool.

11. A method for handling components having a plurality of lateral surfaces and/or edges of the lateral surfaces, comprising the steps:
providing a component stock in a holding and feeding device for the component stock so that the component stock faces a pick-up position;
conveying the one of the components at a time by a discharge device from the component stock located in the holding and feed device in a direction of or to a respective pick-up tool located in the pick-up position;
picking up the one of the components by at least one pick-up tool arranged on a turning device on a top surface of the component;
rotating the at least one pick-up tool in a turning plane around a turning axis;
conveying the one of the components located on the at least one pick-up tool from the pick-up position to at least one inspection position, optionally moving the one of the components from the pick-up position to one or more inspection positions, orientation positions, a set-down position, and optionally an ejection position; and
aligning the component stock in the holding and feeding device in such a way that at least the one of the components to be dispensed is positioned relative to the at least one pick-up tool located in the pick-up position such that
a lateral surface of the one of the components, which encloses an acute angle with the turning plane, encloses an angle of about 30° to about 60° with the turning plane, or
a lateral surface of the one of the components, which encloses an obtuse angle with the turning plane, encloses an angle of about 120° to about 150° with the turning plane, characterized in that
the turning device conveys the one of the components from the pick-up position to the set-down position in an angular orientation of the lateral surfaces relative to the turning plane, and in that
a component inspection device inspects the one of the components conveyed by the turning device with the angular orientation of the lateral surfaces relative to the turning plane in the at least one inspection position.

* * * * *